US006938227B2

(12) United States Patent
Murphy et al.

(10) Patent No.: US 6,938,227 B2
(45) Date of Patent: Aug. 30, 2005

(54) SYSTEM AND METHOD FOR MODIFYING ELECTRONIC DESIGN DATA

(75) Inventors: Michael Murphy, Bridgewater, NJ (US); Eric Schmidt, Canyon, CA (US); Aly Diaz, Aliso Viejo, CA (US)

(73) Assignee: Fry's Metals, Inc., Jersey City, NJ (US)

( * ) Notice: Subject to any disclaimer, the term of this patent is extended or adjusted under 35 U.S.C. 154(b) by 111 days.

(21) Appl. No.: 10/637,251

(22) Filed: Aug. 8, 2003

(65) Prior Publication Data

US 2004/0089413 A1 May 13, 2004

Related U.S. Application Data

(60) Provisional application No. 60/402,300, filed on Aug. 8, 2002.

(51) Int. Cl.[7] .............................................. G06F 17/50
(52) U.S. Cl. ............................................. 716/1; 716/15
(58) Field of Search ............................... 716/14, 15, 1

(56) References Cited

U.S. PATENT DOCUMENTS

| | | | |
|---|---|---|---|
| RE34,615 E | 5/1994 | Freeman ....................... 348/95 |
| 5,669,970 A | 9/1997 | Balog et al. ................. 118/213 |
| 5,807,606 A | 9/1998 | Mould et al. ................. 427/10 |
| 5,982,927 A | * 11/1999 | Koljonen ..................... 382/145 |
| 6,317,513 B2 | * 11/2001 | Michael et al. ............. 382/145 |

OTHER PUBLICATIONS

Valor Computerized Systems, Ltd., "Trilogy/Enterprise, DFM Actions, Software Version 6.0", pp. 1–15 (Aug. 2001).
Valor Computerized Systems, Ltd., "Trilogy 5000 Modules", (visited Jul. 11, 2002), <http://www.valor.com/t5kmods.html>.
Valor Computerized Systems, Ltd., "Trilogy 5000 Overview", (visited Jul. 11, 2002), <http://www.valor.com/t5over.html>.

Goukler, B., "Metal Stencil Overview", (visited Jul. 11, 2002), <http://www.tkb–4u.com/articles/printing/metalstenciloverview/metalstenciloverview.php>.

* cited by examiner

*Primary Examiner*—A. M. Thompson
*Assistant Examiner*—Sun James Lin
(74) *Attorney, Agent, or Firm*—Mintz, Levin, Cohn, Ferris, Glovsky and Popeo, P.C.

(57) ABSTRACT

Customer data relating to the location and character of features (e.g., conductive pads to which electronic parts are soldered on a printed circuit board) are stored in a digital form (e.g., as "Gerber data"). A library of footprints that characterize the features is created from this data. A footprint filter and a modification parameter are then applied to the footprint library to select footprints for modification and to make a desired change to the selected footprints. In a printed circuit board embodiment, apertures in a stencil designed for printing solder on the printed circuit board are then cut in accordance with the footprints. Data representing all the apertures to be cut in the stencil can be moved or scaled to compensate for variations in the printed circuit board manufacturing and stencil manufacturing processes. The above-described method can be carried out via instructions stored as software code on a computer-readable medium.

22 Claims, 6 Drawing Sheets

EDIT MODIFICATION PARAMETER

Mod. Name: se_v_w52_h75

Std. Asymmetric Width: Value ▽  Factor: 1.0  Value: 52.0 ml
Height: Value ▽  Factor: 1.0  Value: 76.0 ml
Std. Symmetric  Distance ▽  Factor: 1.0  Value: 0.0 ml
Non Std.  Distance ▽  Factor: 1.0  Value: 0.0 ml Description: Make aperture .052" x .075"

EDIT FOOTPRINT FILTER

Filter Name: ic_gfp_25_8

Part Type: IC ▽  Part Group: OFP / SOP
Pitch: Range ▽  Is equal to ▽  25 ml  +/- 2.0 ml
Number Of Leads: Range ▽  Is equal to ▽  8

FIG. 4

SYSTEM AND METHOD FOR MODIFYING ELECTRONIC DESIGN DATA

RELATED APPLICATION

Priority is claimed to U.S. Provisional Patent Application Ser. No. 60/402,300, filed Aug. 8, 2002, the entire teachings of which are incorporated herein by reference.

BACKGROUND

In the surface-mount technology (SMT) portion of the electronic assembly industry, printed circuit boards are made by attaching electronic components or parts, such as integrated circuits, capacitors, etc., to a surface of a printed circuit board. These elements are affixed to the printed circuit board in a number of ways, but in particular, by placing dots or deposits of a cream solder material onto metal pads (also known as lands) formed on a printed circuit board. This is often accomplished through the use of a so-called solder screen printer.

Screen printers are well known in the art and an example of such a screen printer is shown in U.S. Re. Pat. No. 34,615, entitled, "Video Probe Aligning of Object to be Acted Upon," which is incorporated herein by reference. Also incorporated herein by reference is U.S. Pat. No. 5,807,606, entitled, "Applying Adhesives to Substrates," and U.S. Pat. No. 5,669,970 entitled "Apparatus for Applying Solder Paste." These patents illustrate and describe a system by which printed circuit boards are, one by one, introduced into a work station. The printed circuit boards, as mentioned above, have formed upon them a number of metallic pads or lands on a surface. These pads or lands are the positions on the printed circuit board that will have affixed to them the various electrical components mentioned above. Usually, a conductive, usually metallic, substance such as solder cream is used for this purpose, although it is well known to affix such parts to pads or lands with non-metallic adhesives as well.

As smaller printed circuit boards, particularly printed circuit boards for such items as small cell phones, digital cameras and personal digital assistants (PDAs) become widespread, a typical printed circuit board with dimensions of about 64 by 64 cm (approximately 25 by 25 inches) after cutting may be subdivided into a plurality of separate circuit board patterns as small as about 2.5 by 7.6 cm (1 by 3 inches) each. This is known as panelization. In the printed circuit board manufacturing process, once the electronic components have been assembled onto the printed circuit boards, the plurality of printed circuit boards will be cut into individual, smaller-sized circuit boards that will eventually find their way into such electronic equipment as noted above.

With the passage of time, SMT has become more sophisticated and more and more components can be placed on a circuit board of a given size, thus increasing component density. The primary method used today in the SMT industry for solder deposition onto pads or lands on a circuit board is a stencil or screen that is usually made of a thin material, often metallic, in which apertures have been cut, either by chemical etching, physical machining or laser cutting, through the thin material. Electroforming is another form of stencil fabrication where apertures are formed by "growing" or plating metallic material around developed photoresist that is later removed resulting in openings.

The apertures formed in the stencil will match with the pads or lands on the printed circuit board when the printed circuit board and the stencil are brought together plane to plane, with the stencil on top of the board. If one were to look through the apertures in the stencil when it is placed in contact with the top of a printed circuit board, the observer would see the metallic pads or lands immediately below each of the apertures (if the cutting of the apertures was performed correctly). It is evident that, if an aperture is formed by mistake in a place where there is no target pad or land, then often the entire stencil must be discarded as it is difficult to repair such stencils due to the nature of their structure. In addition, as printed circuit board designers change a particular component that is to be placed on the printed circuit board, the size and/or location of the pads and lands will also be changed on the printed circuit board. Changes must also be made to the apertures in the stencil to conform to the new part or new size requirements. These changes, of course, require the manufacture of a new stencil; and unnecessary wastage can be avoided or dramatically reduced if the new stencil to be made is manufactured with apertures in the correct location, dimensions and shape. Today, the well-known Gerber file is a software-based representation of the X and Y location of each of the pads for each of the parts on a particular circuit board, together with the shape, size, orientation and centroid of each pad. There may be hundreds and even thousands of parts on a typical circuit board.

In operation, once the stencil has been prepared, a solder material, usually in the form of a viscous solder "cream," is swiped across the top surface of the stencil when the stencil is placed in contact with and on top of the printed circuit board. Solder cream is deposited in those apertures that have been formed in the stencil; and, when the stencil is lifted from the printed circuit board, each of the pads or lands will contain a minute, measured amount of solder. It is therefore important, in order to meet manufacturing restrictions (particularly as components and printed circuit boards are reduced in size), that there be a perfect or near perfect alignment of apertures and pads or lands. Additionally, any redesign of the printed circuit board that requires a redesigned stencil should be done efficiently and cost-effectively. To prepare a stencil and to cut apertures into the stencil to match the printed circuit board pattern of pads and lands is a costly operation, and the cost of an apertured stencil can be as high as $1,500. Obviously, if a mistake is made and an aperture is made in the "wrong" place or the aperture is of the wrong shape or size, the stencil may have to be discarded and another one manufactured. Presently, this is a time-consuming, often manual, task.

Today, existing computer hardware and computer software attempt to automate the process of the manufacture of the apertures in a stencil. For example, assemblers of printed circuit boards may provide to the stencil manufacturer the size, shape and location of pads or lands on printed circuit boards in the form of computer-aided-drafting (CAD) data (e.g., Gerber). This CAD data can then be input into the computer system of the stencil manufacturer; assuming the data is correct, the computer system will then guide the stencil manufacturer to form apertures in the stencil in accordance with the pad and land data.

However, a significant problem is faced when, as mentioned earlier, a printed circuit board manufacturer wants to change that data by changing the size, shape or location of the pads. It should also be noted that it is relatively common in printed circuit board patterns to have a number of different components or other parts on a single printed circuit board. Typically, there are multiple instances of a particular pad pattern formed on a single circuit board. At the present time, when a manufacturer or assembler customer determines to change, for example, the size or shape of the pad of a capacitor (which is generally simply a two-pad contact), the board designer must ensure that the pad changes are made for each and every capacitor (of which there may be dozens) on the printed circuit board. The customer does not usually specify the location on the board where changes are to be implemented. Similarly, the apertures in the stencil must match each of the pad changes. This matching process is presently done manually and relies upon the skill of the stencil manufacturer's technicians to find each and every instance where a change must be made. As mentioned earlier, there may be multiple printed circuit board patterns on each stencil and thus the technician must look for and change perhaps hundreds of pad patterns on the stencil. Otherwise, if the technician fails to observe even one capacitor that is being changed, the entire stencil may be incorrect; and the error may not even be realized until the manufacturing process has begun, and defective printed circuit boards that do not have solder deposited on all the pads may halt or significantly slow the printed circuit board manufacturing process. This is costly and to be avoided.

There are a number of software products commercially available that will translate printed circuit board manufacturers' data into stencil-aperturing data. One such example of this is the TRILOGY 5000 software product manufactured by Valor Computerized Systems, Limited of Eyavne, Israel. The TRILOGY 5000 product is described in the Valor TRILOGY Software Manual, Version 6.0, available from Valor Computerized Systems. The TRILOGY software is available to operate on a Personal Computer running Windows, as well as on, for example, a Sun workstation running UNIX. Thus, it would be desirable to have a non-manual/automated system that would allow for an efficient and cost effective redesign of stencil aperturing in a manner that eliminates, or substantially eliminates, human error and that integrates with the present systems for aperture design, such as the TRILOGY 5000 product, to allow for efficient initial design of stencils, as well as modification of such stencils as printed circuit board manufacturers make changes in such boards.

In addition to the need to quickly and accurately create aperture data that aligns with the landing pads on the PCB, precise alignment of the pad and aperture is important. If an aperture is present for each pad but not precisely aligned with it, a material deposit will be made entirely or partially off the pad that results in component-to-PCB connection problems later in the assembly process. Misalignment of the aperture and pad have several primary causes including: variables in the PCB manufacturing process, tolerances in the printing equipment alignment systems, variations inherent to the various stencil fabrication processes, changes that occur in pad/mask definition after initial reflow on 2-sided SMT PCBs, etc. Assemblers have historically compensated for the variables by shrinking the size or changing the shape of the aperture to increase the likelihood that most or all of the aperture will align with the pad.

SUMMARY

This disclosure relates to the positioning of features, such as apertures in the design and the manufacture of stencils. Stencils manufactured for the printed circuit board manufacturing process include apertures formed in a relatively thin, but solid, usually metal, surface. The apertures conform to locations through which material, including solder paste and adhesives, may be passed to an underlying substrate, such as a printed circuit board.

The problems and inadequacies exhibited by prior systems can be obviated by providing an automatic, software-driven system that operates in conjunction with existing aperture design software to allow the user to quickly and cost effectively make changes in existing stencils without substantial human intervention, thus limiting this potential source of mistakes.

This solution can be achieved by defining footprints indicating the character and location of particular parts and pads and thus apertures related to such parts, as provided by a customer. A footprint library is established, which serves as a database for each of the created footprints. Changes can then be made to particular footprints to change the location, shape or size of apertures in stencils that are produced from the footprints. Specifically, a footprint filter that identifies criteria parameters with the footprint is applied to the library to identify footprints that meet the specified criteria. A modification parameter is then applied to the identified footprints to modify those footprints to implement the desired changes. Those changes are then fed into the system that will form the apertures in the now modified stencil.

The software can also include code that moves and scales data representing the apertures to be cut in the stencil to compensate for variations in the printed circuit board manufacturing process and in the stencil manufacturing process. Scaling can be performed by measuring X- and Y-coordinate differences as well as rotational differences between (a) the stencil apertures or the PCB pads and (b) feature locations in the raw (e.g., Gerber) file. The differences in the locations of the stencil apertures and PCB pads can be determined as a function either of known effects in the manufacturing processes or from actual measurements.

Although the description generally focuses on printed circuit boards and stencils designed for printing solder paste thereon, the methods and software described herein can likewise be used in any type of system where other types of features have spatial characteristics that are subject to change.

BRIEF DESCRIPTION OF THE DRAWINGS

In the accompanying drawings, described below, like reference characters refer to the same or similar parts throughout the different views. The drawings are not necessarily to scale, emphasis instead being placed upon illustrating particular principles of the methods and apparatus characterized in the Detailed Description.

FIG. 3 is a screen shot of an interface for creating a modification parameter.

FIG. 4 is a screen shot of an interface for creating a footprint filter.

DETAILED DESCRIPTION

Figure 1:
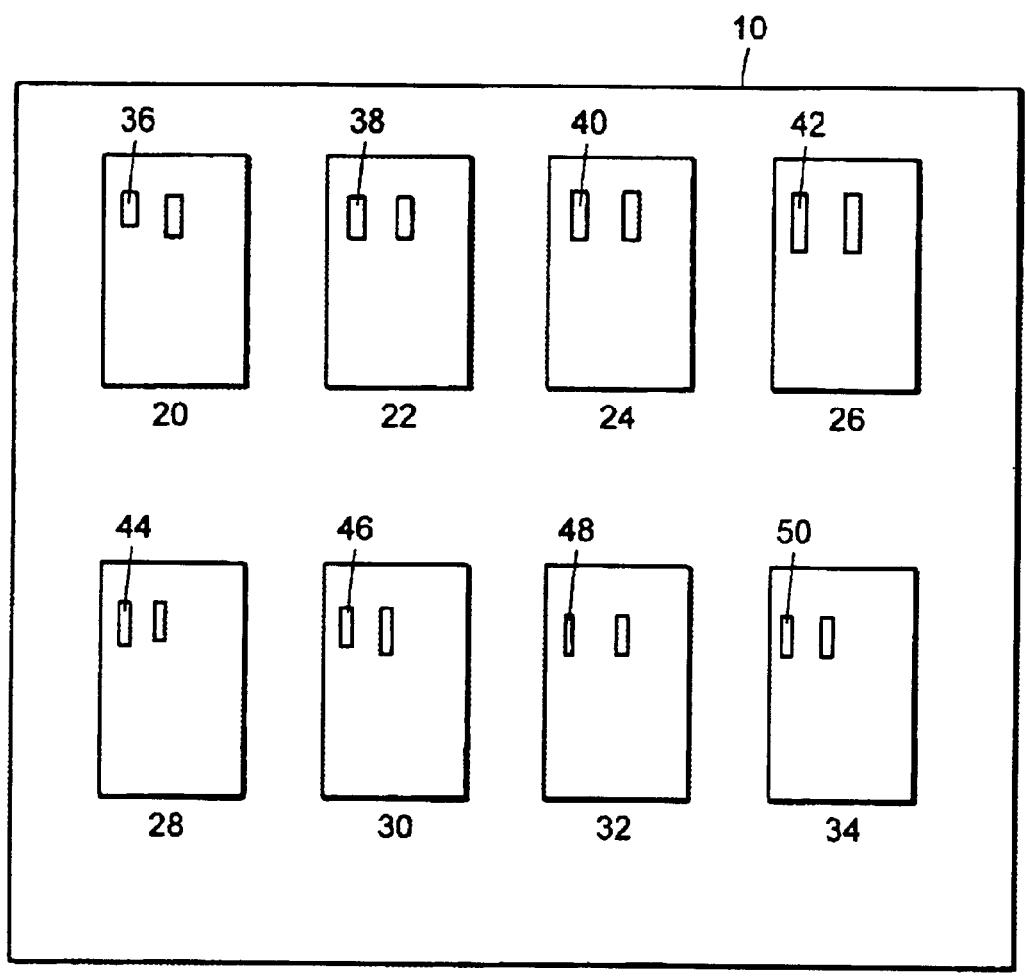
FIG. 1 illustrates an apertured stencil having multiple images formed thereupon.

FIG. 1 illustrates a stencil 10, much as described above, that has a series of images 20, 22, 24, 26, 28, 30, 32 and 34 formed on the stencil. In the embodiment of FIG. 1, the eight images correspond to eight individual circuit board patterns. The eight are chosen by example only, and the stencil may contain one or any number of images. Each of the images contains a number of apertures. By way of example only, apertures 36, 38, 40, 42, 44, 46, 48 and 50 are formed on identical images 20, 22, 24, 26, 28, 30, 32 and 34, respectively. It is noted that each of the apertures 36, 38, 40, 42, 44, 46, 48 and 50 is in the same location with respect to the image and that location corresponds to the position of a pad or other area in which it is desired to deposit solder cream onto a printed circuit board. As shown, there is a set of apertures 36, 38, 40, 42, 44, 46, 48 and 50 that correspond to a simple capacitor that requires only two contact pads. Hundreds of pads, and thus apertures, may be required for a particular device, such as for an integrated circuit, to be attached to a printed circuit board; but, for purposes of simplicity, the example of a two-pad capacitor component is sufficient.

The TRILOGY 5000 software, discussed above, can, among other things, take data received from the printed circuit board assembler and construct a system to cause the stencil manufacturer to cut apertures 36, 38, 40, 42, 44, 46, 48 and 50 in the images 20, 22, 24, 26, 28, 30, 32 and 34 through the stencil. The TRILOGY software relates an aperture, or a set of apertures, to a particular computer hardware component or "part." Users of the TRILOGY software can select a particular part and assign particular attributes to it, such as size, shape and the number and location of contacts that must then correspond to the size, shape, number and location of the pads on the printed circuit board and, consequently, to the apertures in the stencil that is to be placed on the printed circuit board. Thus, the particular part is identified, given a name and saved in the memory of the computer system that the computer software operates.

As mentioned above, however, with the TRILOGY software, when any of the apertures 36, 38, 40, 42, 44, 46, 48 and 50 is resized, relocated or reshaped, the operator must individually and manually find each instance of such aperture on each of the components/parts and make the modification to it. In many cases, parts with similar functionality but, perhaps manufactured by different companies, have different pad sizes on the PCB. Each must be saved separately. Customers make modifications according to the part; thus, all these similar parts, with different names, must be located and the attributes changed. Obviously, this is time consuming and can cause mistakes due to inevitable human error.

Under one embodiment of the present invention, a further identification number is given to each component or part and, thus, to the set of apertures relating to that part and, when a change is to be made to that part, the software recognizes every instance of that part throughout the printed circuit board pattern and applies the changes uniformly to each and every one of the sets of apertures corresponding to the part that is to be changed or otherwise modified. When a printed circuit board manufacturer sends a modification schedule to the stencil manufacturer to modify one or more of the parts on the printed circuit board, thus requiring modification of the apertures in the stencil, the stencil manufacturer begins the process of identifying, searching for and then modifying the sets of apertures made on each of the images of the stencil.

The software application, described herein, is stored on a computer-readable medium (e.g., a hard drive, CD, floppy disk, etc.); and the medium is in communication with a computer processor that executes instructions embodied in the software code and processes the data embodied in the software components, described below. The following three components of the software application, described in detail below, are utilized to modify the apertures: (a) "footprint/symbol library," (b) "footprint filters," and (c) "modification parameters." Further, there are specific "modification rules" programmed in the system and applied to the data file for the purpose of changing the size, location and/or shape of the apertures. The software application can also include code for altering the relative positioning of a laser and a stencil to cut apertures in the stencil with the laser in accordance with a selected footprint.

Figure 2:
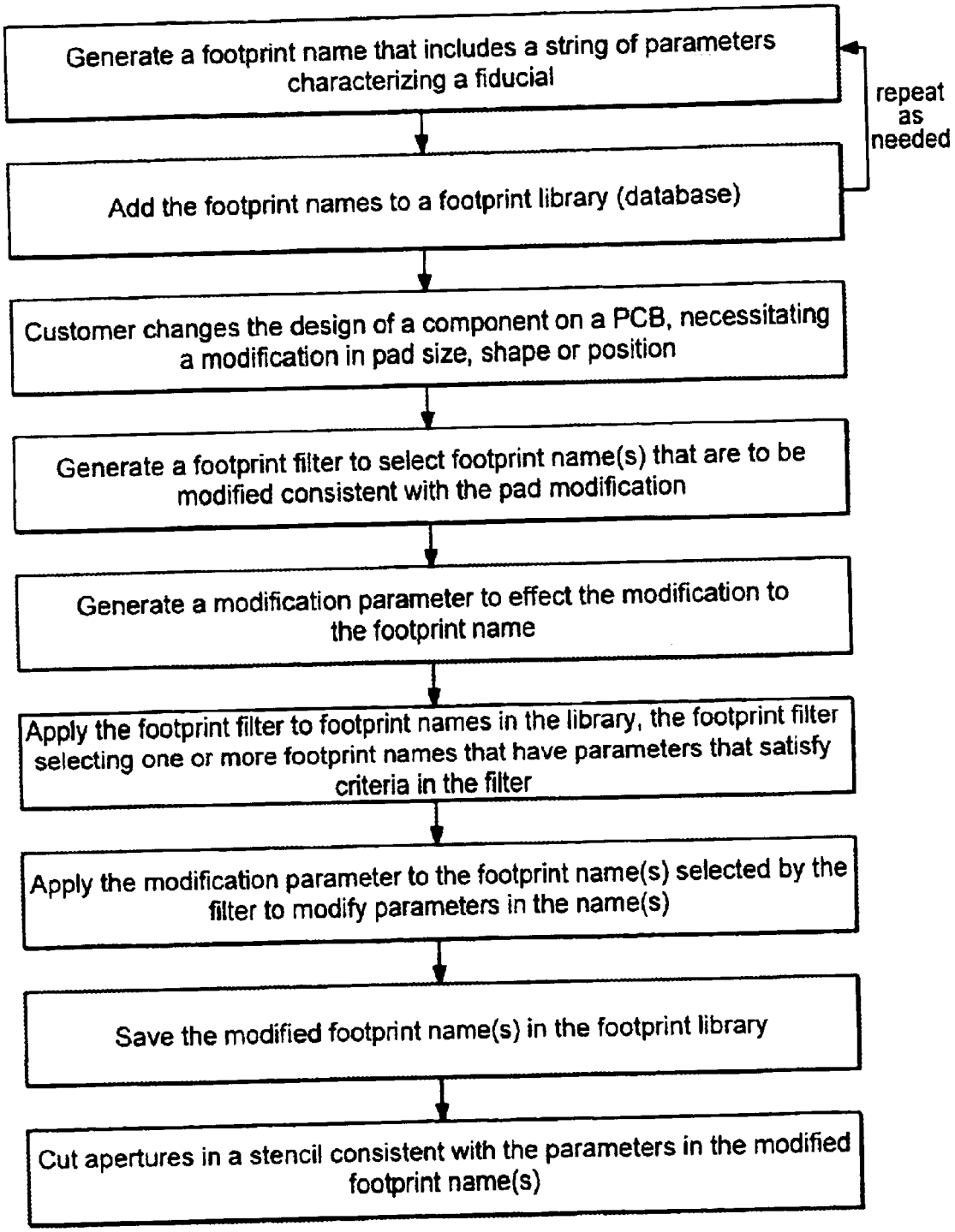
FIG. 2 is a flowchart showing an overall diagram of the operation of the system.

A solder paste extraction (SPE) module in Valor's TRILOGY 5000 software application analyzes the submitted Gerber data and embedded aperture list (e.g., Gerber 274x) that represents the landing pads of the parts to be connected. These pads also indicate the corresponding apertures that must be present on the stencil in order to deposit the printed material in the correct location. The SPE module analyzes pad "patterns" against established component footprints in the footprint library. This is referred to as "footprint matching." New footprints are created for all unmatched pad patterns and saved in the footprint library. For use in a software program, such as the DIMENSIONS commercial software program (available from Cookson Electronics Assembly Materials, Jersey City, N.J., USA), each footprint is given a unique name based on a particular naming convention, which is described in greater detail below, and which is illustrated as an initial step in the process shown in the flow chart of FIG. 2.

Once the submitted job has a match for all the pad patterns and a footprint association is made, the software applies any modification rules that have been set up for the customer submitting the data. Each rule is a combination of a footprint filter and modification parameter. The footprint filter selects the parts to be modified from the matched footprints using some part or all of the footprint name. The modification parameter includes instructions on what changes must be made to the size of the selected parts. The rule set-up tool in the software first asks the user which footprint is to be modified and then asks what sort of modification is to be made to the footprint (by way of altering the Gerber file). The rule set-up tool also includes a functionality that can change the shape, orientation or position of the aperture relative to the pad. Once all changes are applied, the new set of data is saved and the new file is then used for fabricating the stencil.

A combination of rules make up a modification set. Customers may have an unlimited number of different modification sets.

The process begins with footprint naming. The software utilizes a naming convention, wherein an example of an integrated circuit footprint is given the designation, ic_qfp_40_120_180_230_oval_6pinrect_25x80. The "ic" is the part type, and it indicates that the footprint is for an integrated circuit, and "qfp," which stands for quad flat packs, is the name of the part group. The first number in the sequence is the pitch (i.e., the distance between the centers of proximate leads) measured in mils (here, 0.040 inches), and the second number is the number of leads (here, 120 leads). The next two numbers are the center-to-center width and height (both in mils), which are measured with imaginary horizontal and vertical lines between the centers of proximate pads with the board oriented along a vertical plane. In this embodiment, the center-to center width is 0.180 inches, and the center-to-center height is 0.230 inches.

The next two terms provide an identification of the pad shape. Here, the shape of the pads is oval, except every sixth pin is rectangular. The final identifier reflects the dimensions of the pad, in mils. Here, the pads have a width of 0.025 inches and a height of 0.080 inches (where the pad's greatest dimension is regarded as the height). A customer-specific identifier (e.g., a "ship to" number) can also be inserted into the footprint name to enable the footprint to be associated with a particular customer.

The software also enables modification of existing footprints that are stored within the database. For example, a customer may, due to the introduction of a new smaller-sized part, specify that all 40-mil quad flat packs (QFPs) be reduced by 10% in size. In addition, the customer may specify that all 40-mil ball grid array (BGA) apertures be made square, rather than, for example, round or rectangular. The software includes a database in which are stored footprint filters and modification parameters. When editing or creating a footprint filter and a modification parameter, the software first searches the existing sets in the database. The same filter may have already been created or the same Footprint filters define the parts or components that are to be edited by a particular modification parameter. In an example, a modification parameter is created to reduce all parts identified by the footprint filter by 0.003 inches globally. Alternatively, dimensions can be magnified or shrunk (e.g., reduced by 10%) by setting a factor, which is then multiplied with the dimensions of the original footprint. Modification parameters define how pad data will be modified to comply with a particular aperture design specification change. Modification parameters can be set to globally modify all pad shapes and sizes or set to modify only a pad's width or height.

A unique naming convention can be employed when creating or editing modification parameters. The convention identifies how parts of certain shapes get edited. Based on the selections and input to each field, the parameter can be named using the following rationale, wherein an underscore is placed between each part of the name, except the dimension and associated factor or value.

|  |  |  |  |  | 2nd Level (Repeat for different Edit Mode type) | | |
| --- | --- | --- | --- | --- | --- | --- | --- |
| Parts Targeted | Edit Mode | Dimension | Factor or Value | Dimension | Factor or Value | Edit Mode | Dimension | Factor or Value |
| all = all parts; sa = asymetrical parts; ss = symmetrical parts; ns = nonstandard parts. | d = distance; v = value; f = factor; wh = width/ height. | Blank = global; w = width. | # number | h = height | # number | d, v, f, wh | w, h | # number | modification may already have been performed for that or another customer. If the database includes the footprint filter and modification parameter already, then they are just applied as a rule. If not, then the user creates the footprint filter and the modification parameter. Changes such as these can be applied to one or more footprints assigned to a particular customer, or the changes can be made more globally (generically) to all footprints sharing common attributes among specified parameters regardless of customer association. If the change is intended to be customer-specific, the customer-specific identifier in the footprint name is compared with customer-specific criteria in the footprint filter; and, if there is a match, the footprint name is modified in accordance with the provided modification parameters.

Once a particular footprint name is assigned to a particular component, changes to the same components throughout the printed circuit board or boards can be identified and modified in accordance with footprint filters and modification parameters. The process is illustrated graphically in FIG. 2, wherein the footprints are named and added to a library; and, as is further explained below, a footprint filter is applied to the footprint names. A modification parameter is then applied to the footprint names to modify parameters therein. The modified footprint names are then used to produce a modified stencil data pattern in accordance with a particular aperture design specification.

Examples of modification parameter names follow. A modification parameter for making an aperture having a 0.052-inch width and a 0.075-inch height for all discretes of a certain size (as defined by the footprint filter) is named, "sa_v_w52_h75." A screen print showing the creation of this modification paaramter is provided as FIG. 3. In another example, a modification parameter for reducing certain integrated circuits (as defined by the footprint filter) by 0.004 inches in height and by 5% in height is named, "sa_d_w4_f_h.95." In yet another example, all parts identified by the footprint filter are reduced by 0.003 inches globally via a modification parameter named, "all_d_3."

Footprint filters define the parts or components to be edited by the designated modification parameter. The filters can be general, having a high likelihood of use in modification sets for multiple customers in the future; or the filters can be specific, meaning that the filter is unique to a given customer and there is little chance for re-use by other customers in future modification sets. Specific filters use the "ship to" number from the associated customer record as a prefix for identification.

The software provides an interface, as shown in the screen shot illustrated in FIG. 4, for the user to enter selections and instructions to create the footprint filter. The software then applies the footprint filter to the filter to find the corresponding part footprints in the customer's data file that meet the criteria specified in the filter in order to apply the parameter edits to the selected footprints. The available part features listed in the footprint filter are associated with pieces of the footprint names in the footprint library.

The system administrator can access the filter administration area through an on-screen main menu. Generally, the filter to be created is based upon the goal of the rule for which it is being set up. For example, if the rule states "home plate all capacitors and resistors over 0.030 in.×0.050 in.," the filter must target all capacitors and resistors with pad sizes greater than 0.030 inches×0.050 inches (the shape tool will change the aperture for these parts to five-sided figures resembling a "home plate," as found on a baseball diamond). Specific fields and associated options within the software interface enable the filter "string" to be created automatically by software as a function of conditions entered by the user. As more fields are used and as more information is entered, the filter becomes more specific.

Within the on-screen interface provided by the software, a first drop-down menu (as seen in FIG. 4), labeled "part type," is provided allowing the user to specify the part type. Available options include the following: (a) "all," which represents all parts in the data; (b) "IC," which represents integrated circuits, which are generally multi-leaded, 2- or 4-sided devices [selecting IC allows you to narrow the filter to QFP'S (quad flat packs) or SOP's (small outline packages)]; (c) "BGA," which represents ball grid arrays, regardless of package composition, (d) "discrete," which represents passive devices that are multi-leaded and that can have a wide variety of shapes and sizes.

A second drop-down menu, labeled, "pitch," includes the following options that can be selected by the user: (a) "all," which includes all pitch sizes, and (b) "range," which allows values to be entered that narrow the filter to selected parts with the associated pitch values, where the user can also provide instructions for the filter to include parts smaller or larger than the value entered via on-screen drop-down menus and/or data-entry windows, and where optional tolerance values can also be entered to cover variations in design data that normally occur between different job files.

A third drop-down menu, labeled, "number of leads," offers the following options: (a) "all," which includes parts with any number of leads; and (b) "range," which allows the filter to find parts with a specific number of leads (pads) or parts having a number greater or lesser than specified, again via selections and data entered via additional drop-down menus and or data-entry windows.

Two additional drop-down menus, labeled, "footprint width" and "footprint height," offer similar options: (a) "all," which includes all parts regardless of footprint width or height; and (b) "range," which narrows the filter to only include parts with footprints of a specific height or width; yet another window is provided to allow entry for a tolerance, which is provided to ensure that the system includes similar parts in the search that are close to the targeted size within the pre-set tolerance. The footprint dimensions are determined by "framing" the part based on the center points of the outermost pads.

Similarly, drop-down menus are provided for "pad width" and "pad height." This filter allows selection either of (a) "all," which includes all parts regardless of the part's pad width or height; or (b) "range," which narrows the filter to only include parts with surface-mount-technology pads of a specific height, width or both; an additional window is again provided to allow entry for a tolerance. The pad dimensions are determined by measuring between the outermost points of each pad.

Further still, a "special pad" menu offers the selection of either (a) "all," which includes all parts regardless of shape, and (b) "range," which allows the filter to find footprints containing special and/or unique shape designations in the footprint name; for example, a certain 0.025-inch pitch QFP may have oval pads, and the customer may wish to modify these parts in a manner different from the QFP's with rectangular pads.

Finally, a "special features" menu offers selection of either (a) "all" or (b) "range," which directs the filter to find footprints containing some special feature, designated by the user. For example, a particular part may have pads that have chamfered corners, or the part may have all rectangular pads except for every $6^{th}$ pad, which may be oval. Generally, this component of the filter string will be used by an administrator targeting a very specific part.

The footprint-filter naming convention is similar to that of the footprint, itself, as well as that of the modification parameter. Again, the various parameters are entered and separated by underscores. Because search filters use the naming "string" to assist the rules administrator in locating a previously entered filter and for overall consistency, the naming convention must be strictly followed.

The filter name may be broad or specific. As the filter name is made more specific, it goes further into the footprint naming "string." As the filter becomes more specific, each preceding footprint feature is represented. So if the filter will be targeting parts down to the pad dimension level, an entry for each preceding feature (part type, pitch, number of leads, footprint dimensions) is included in the name. Features in the naming string that come after the level of specificity needed do not need to be included in the filter name.

The components and options for the various parameters in the filter name are illustrated in the following chart:

| Customer Number (if Filter is specific) | Part Type | Sub-Part | Pitch | # of Leads | Footprint | | Pad | | Special Pad | Special Features |
|---|---|---|---|---|---|---|---|---|---|---|
| | | | | | Width | Height | Width | Height | | |
| | All | | All | All | All | All | All | All | All | All |
| | IC | SOP, QFP | Value | Value | Value | Value | Value | Value | Description | Description |
| | BGA | | Value | Value | When used, the Tolerance value should be placed in | | | | | |
| | Dis | Pad size variations: s = single; m = multiple | Value | Value | parentheses next to the field value in the Filter name. Place the <, > or =<, => designations in front of the associated field value. | | | | | |

As an example, a general filter name for a rule making apertures that are 0.032 inches wide and 0.047 inches long for all discrete parts (e.g., capacitors, resistors, etc.) that have an outline or footprint greater than 0.080×0.050 inches (for which the pad size is 0.030×0.045 inches) is "dis_s_ all_2_all_>30×45." A second example of a filter name (it's creation illustrated in FIG. 4) is for reducing a 0.025-inch pitch of 8-pin QFP's by 0.004 inch in width and by 5% in height (and with a tolerance specification included). The filter name in this example is as follows: "ic_qfp_25(2)_ 8." A third rule, this one for reducing all square BGA parts by 0.003 inches globally, is implemented with a filter, named, "bga_all_all_all_all_square." Finally, a rule making apertures oval on all resistor networks with pad sizes of 13×15 mils for a particular customer is implement with a filter having the name, "130772_ic_sop_all_8_all_all_ 13×35."

The interaction between footprint filters, footprint naming and modification parameters works as follows. When it is desired to create a rule (i.e., a set of instructions that will modify each and every instance of a particular design part), the user first selects an appropriate footprint filter that represents the component or group of components that are targeted for changes. In the next step, the user selects an associated modification parameter. The program compares the parameters of the footprint filter with those of the footprints to identify all parts on the circuit board to which the modification parameter is to be applied. The data file that includes the information on pads (e.g., size, location, etc.), which is maintained for a particular circuit board or set of circuit boards, is then modified and updated with the modifications from the modification parameter. The modified data is then saved and used for manufacturing the stencil.

To automatically correct for the various causes of aperture-to-pad misalignment, the system utilizes a unique method for recording and applying compensation factors to the design data. Using a combination of default tables and other fields requiring completion by the user during order entry, the system performs a number of calculations to generate a series of values that are ultimately used to move each of the image features slightly in order to improve aperture-to-pad alignment.

Figure 5:
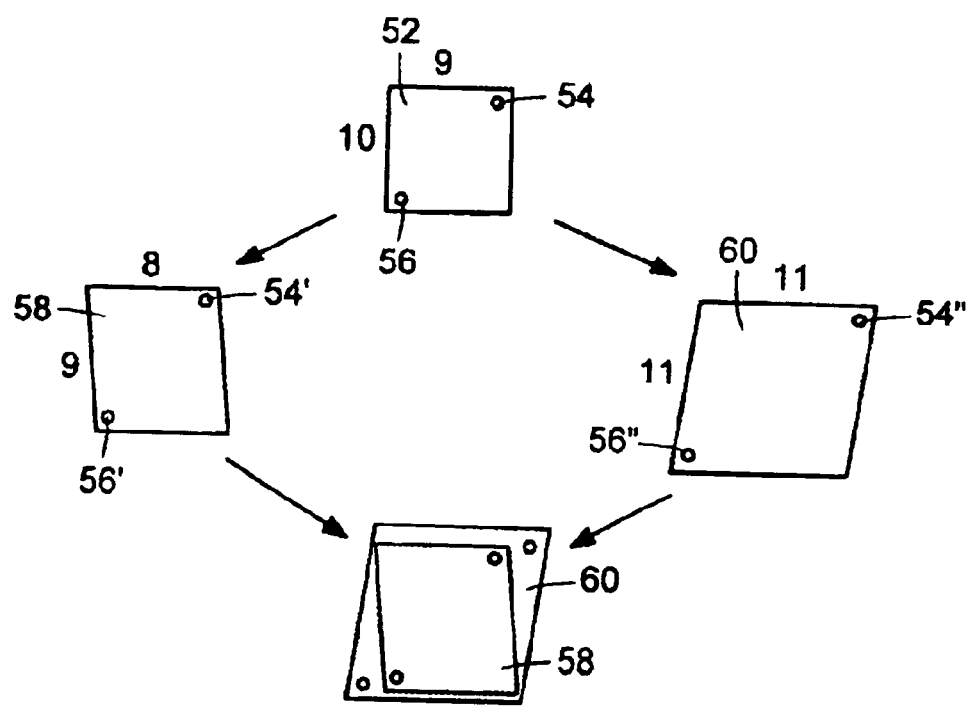
FIG. 5 illustrates exemplary deviation in feature locations from Gerber coordinates in fabricated printed circuit boards and in fabricated stencils.

The kind of design problems that can arise if some effort is not made to tailor the stencil design to the actual dimensions of the manufactured printed circuit boards that are being printed are illustrated in FIG. 5. The configuration 52 is a representation of the Gerber data, as designed and supplied by the customer, including features 54 and 56. The printed circuit board 58 is an implementation of the Gerber data, as imaged by the PCB manufacturer; the PCB 58 includes features in the form of pads 54' and 56'. The stencil 60 is an implementation of the Gerber data, as cut by a laser; the stencil 60 includes features in the form of apertures 54" and 56". Deviations in the board 58 can result from, e.g., board shrinkage and rotation during processing; and deviations in the stencil can result from, e.g., exposure to tension and high temperature, the age of the lamp, and wear of the gantry system in the apparatus used to cut the stencil. Both the printed circuit board 58 and the stencil 60 are rhombuses. At the bottom of this configuration is an overlay of the PCB 58 and the stencil 60, as aligned by a printer vision system. The numbers along the edges of the bodies are measurements of the side lengths (e.g., in inches).

The difference in feature locations highlights the impact of the different levels of data scaling that can be applied to remove or reduce those differences. The levels of data scaling include the following:

a) PCB scaled to data: known effects of the PCB laminating and manufacturing process can be overcome by compensation for these effects by scaling the data on X- and Y-axes and rotation in order that the end product (in this case, the PCB) matches up as closely as possible to the theoretical data.

b) Stencil scaled to data: known effects of the stencil manufacturing process can be overcome by compensation for these effects by scaling the data on X- and Y-axes and rotation in order that the end product (in this case, the stencil) matches up as closely as possible to the theoretical data.

c) Stencil scaled to PCB: known effects of the stencil manufacturing process can be overcome by compensation for these effects by scaling the data on X- and Y-axes and rotation in order that the end product (in this case, the stencil) matches up as closely as possible to the fabricated PCB batch.

Figure 6:
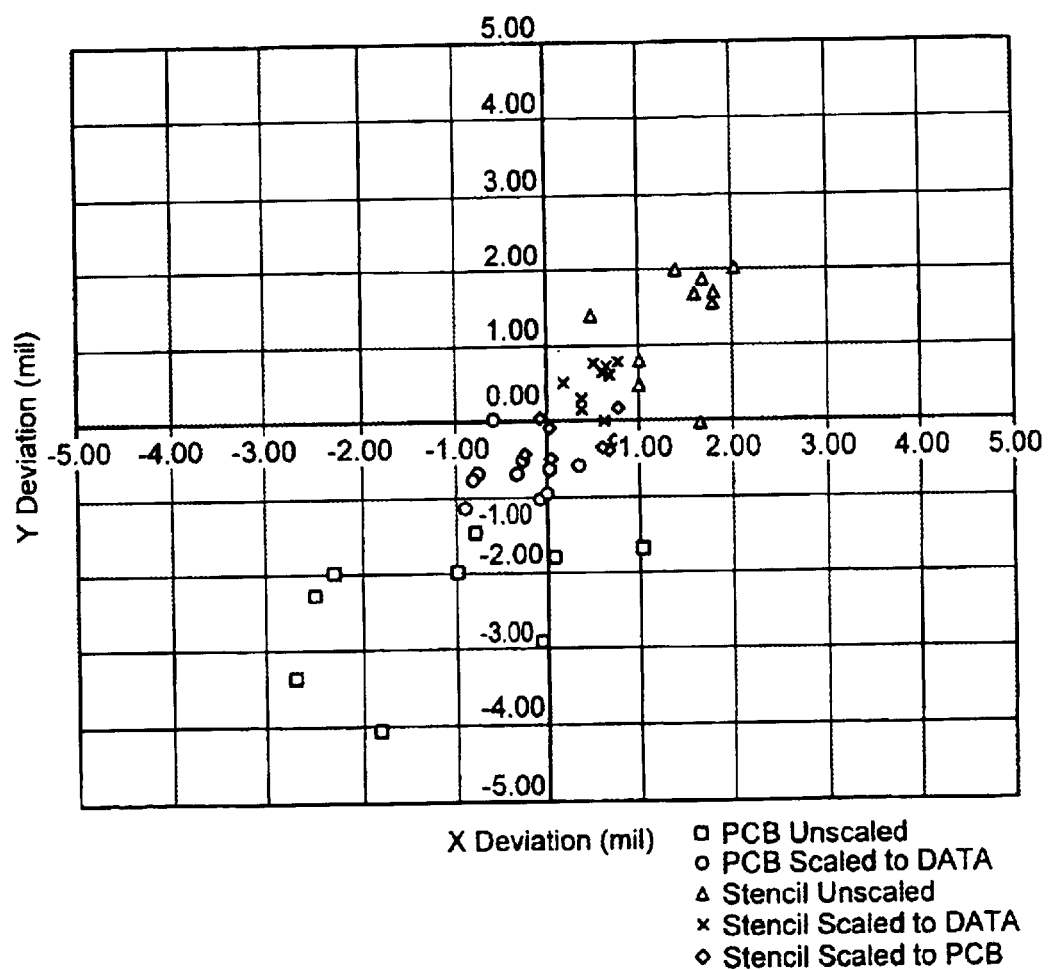
FIG. 6 is a chart illustrating deviations in pad and aperture locations from Gerber coordinates in printed circuit boards and the bottom sides of stencils; plots are provided for measurements made with and without various forms of scaling.

Examples of data points taken from the deviation in position (measured in mils) of PCB pads and apertures from Gerber data is shown in FIG. 6. From the bottom left to the top right of the chart, sets of measurements of deviation from Gerber data are shown for the following: (a) PCB pad locations, wherein the PCB was fabricated without scaling; (b) PCB pad locations, wherein the pads were positioned with scaling for known effects of the PCB laminating and manufacturing process; (c) stencil aperture locations, wherein the apertures were scaled to a fabricated PCB (this set showed the least deviation); (d) stencil aperture locations, wherein the stencil apertures were positioned with scaling for known effects of the stencil manufacturing process; and (e) stencil aperture locations, wherein the stencil was manufactured without scaling.

In order to prevent the situation shown in FIG. 5 and to manufacture a stencil that aligns correctly to the printed wiring board, three numbers, designated as $F_X$, $F_Y$ and $X_{ROT}$, are used to quantify how much the board differs in size and shape from the original Gerber Instructions, as provided by the customer.

$F_X$ is a number that typically will range between 0.999 and 1.001. $F_X$ is obtained by measuring how far apart two board features are along the X-axis and then dividing this measured number by the distance actually stated in the Gerber file $F_Y$ is a number that typically will range between 0.999 and 1.001. $F_Y$ is obtained by measuring how far apart two board features are along the Y-axis and then dividing this measured number by the distance actually stated in the Gerber file.

$X_{ROT}$ is a number that typically will vary between −0.0006 and +0.0006. $X_{ROT}$ is obtained by measuring the X and Y coordinates of two features on the board that are relatively far apart in the Y-axis but which have the same X coordinate in the Gerber file.

$X_{ROT}$ is then defined as follows:

$$X_{ROT} = (X_{2A} - X_{2G})/(Y_{2A} - Y_{0A}),$$

where G refers to Gerber data and A is used as a subscript for actually measured data, where 0 is used as a subscript for a data point at a focal point of rotation, and where the subscript, 2, is used for a data point vertically displaced from the focal point.

Figure 7:
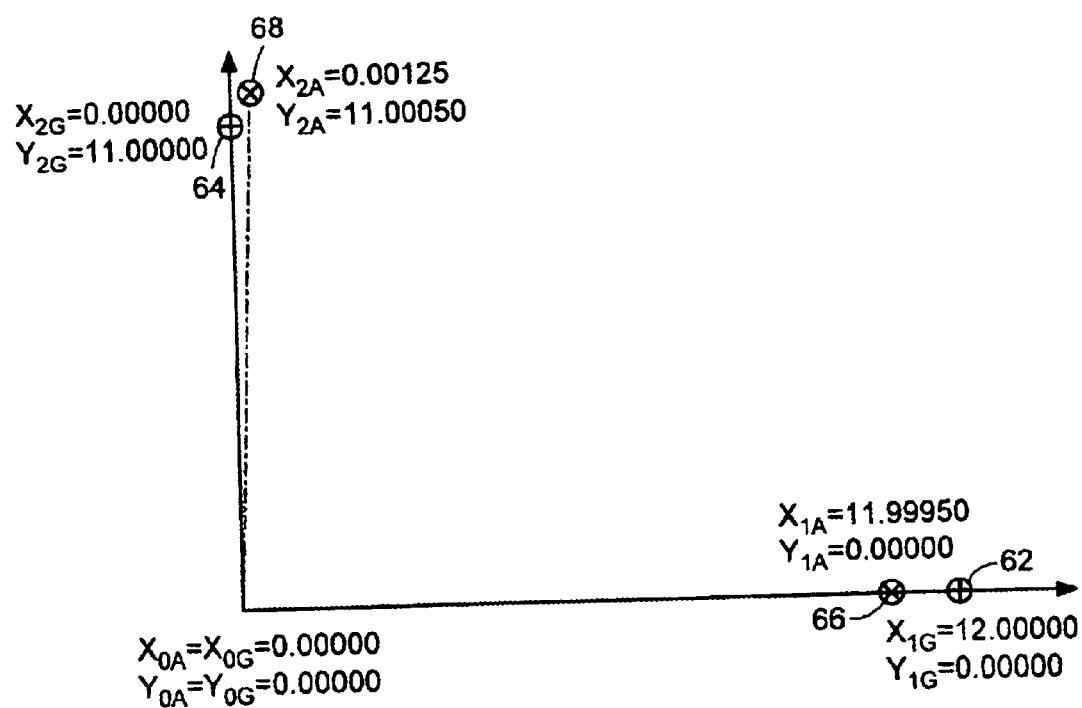
FIG. 7 is a chart comparing actual coordinates on a printed circuit board and the corresponding Gerber coordinates, wherein the coordinates are used to calculate rotation of the coordinates on the printed circuit board.

FIG. 7 shows a numerical example that measures a minimum number of points to calculate all three factors. Data points 66 and 68 represent actually measured values from the PCB, while data points 62 and 64 represent the Gerber coordinates. As more data points are used to calculate each value, the stencil is fitted more precisely to the actual board dimensions. For best results, 4 or 5 determinations of $F_X$ should be made at different points going up the Y-axis and the results averaged. Similarly, 4 or 5 determinations should be made of each $F_Y$ value going along the X-axis. And finally, the $X_{ROT}$ values themselves should be measured at 4 or 5 locations going across the X-axis.

In the example illustrated in FIG. 7, $F_X$, $F_Y$, and $X_{ROT}$ can be calculated as follows:

$$F_X = 11.99950/12.00000 = 0.99995833 \Rightarrow (X_{1A} - X_{0A})/(X_{1G} - X_{0G})$$
$$F_Y = 11.00050/11.00000 = 1.00045455 \Rightarrow (Y_{2A} - Y_{0A})/(Y_{2G} - Y_{0G})$$
$$X_{ROT} = 0.00125/11.00050 = 0.000113631 \Rightarrow (X_{2A} - X_{2G})/(Y_{2A} - Y_{0A})$$

Once the $F_X$, $F_Y$, and $X_{ROT}$ values are calculated, additional calculations are applied to the original Gerber data coordinates in order to create new data that will be used to manufacture the stencil. Each image-related coordinate should be repositioned using the following calculations:

$$\text{New } Y = Y_G * F_Y;$$

$$\text{New } X = (X_G * F_X) + (X_{ROT} * F_Y).$$

Stencil apertures are then cut with the position of the apertures established by the new X- and Y-coordinate values.

Thus, a system that is efficient, economical and virtually free of human error has been described. While the exemplary embodiment has been described as applicable to the printed circuit board assembly industry, the present invention is also applicable to other industries in which CAD/CAM data is used in the production of various products, such as the printing business, the carpet and material business and the clothing business.

In describing embodiments of the invention, specific terminology is used for the sake of clarity. However, the invention is not limited to the specific terms so selected, and each specific term at least includes all technical and functional equivalents that operate in a similar manner to accomplish a similar purpose. In addition, it should be understood that in some instances where a particular embodiment of the invention includes a plurality of system elements or method steps, those elements or steps may be replaced with a single element or step and vice versa.

While this invention has been shown and described with references to particular embodiments thereof, those skilled in the art will understand that various changes in form and details may be made therein without departing from the scope of the invention, which is limited only by the following claims.

What is claimed is:

1. A method for modifying electronic printed-circuit-board design data, the method comprising:
   accepting customer data indicating the location and character of pads to which electronic parts are to be soldered on a printed circuit board;
   from the customer data, creating footprints including parameters relating to pad configurations on the printed circuit board;
   creating a footprint library that includes a plurality of the footprints;
   applying a footprint filter that specifies criteria for one or more footprint parameters to the footprints in the footprint library to select footprints that meet the specified criteria;
   applying a modification parameter to the footprints selected by the footprint filter to modify one or more parameters in the selected footprints; and
   utilizing the footprints to cut apertures in a stencil.

2. The method of claim 1, wherein each of the footprints is assigned a name that incorporates each of the parameters.

3. The method of claim 1, further comprising the steps of creating the footprint filter and modification parameter as a function of a customer request to change a stencil aperture to align with a changed pad on the printed circuit board.

4. The method of claim 1, further comprising establishing a library of footprint filters and searching the footprint-filter library to determine whether a suitable footprint filter already exists to effect a change requested by a customer.

5. The method of claim 4, wherein:
   if a suitable footprint filter is found, the suitable footprint filter is applied to the footprints in the footprint library; and
   if a suitable footprint filter is not found, a new footprint filter is created and applied to the footprints in the footprint library.

6. The method of claim 4, further comprising establishing a library of modification parameters and searching the modification-parameter library to determine whether a suitable modification parameter already exists to effect a change requested by a customer.

7. The method of claim 6, wherein:
   if a suitable modification parameter is found, the suitable modification parameter is applied to the selected footprints; and
   if a suitable modification parameter is not found, a new modification parameter is created and applied to the selected footprints.

8. The method of claim 1, wherein the footprint includes parameters indicating part type, part group, pitch, number of leads, footprint dimensions, pad shape and pad dimensions.

9. The method of claim 8, wherein the footprint further includes a parameter indicating a customer with which the footprint is associated.

10. The method of claim 9, wherein the footprint filter specifies the customer.

11. The method of claim 1, further comprising scaling data in the footprint as a function of X- and Y-coordinate differences to compensate for known effects of at least one of a printed circuit board manufacturing process and a stencil manufacturing process.

12. The method of claim 11, further comprising scaling data in the footprint as a function of rotational coordinate differences to compensate for known effects of at least one of the printed circuit board manufacturing process, and the stencil manufacturing process.

13. The method of claim 1, further comprising scaling data in the footprint to the fabricated printed circuit board as a function of X- and Y-coordinate differences between the customer data and actual pad locations on the printed circuit board.

14. The method of claim 13, further comprising scaling data in the footprint as a function of rotational coordinate differences to compensate for differences between the customer data and actual pad locations on the printed circuit board.

15. A computer-readable storage medium storing program code for causing a computer to:
   create footprints that include parameters relating to spatial characteristics of features;
   create a footprint library including a plurality of the footprints, wherein the footprint parameters are searchable within the footprint library;

apply a footprint filter that specifies criteria for one or more footprint parameters to the footprints in the footprint library to select footprints that meet the specified criteria; and apply a modification parameter to the footprints selected by the footprint filter to modify one or more parameters in the selected footprints.

16. The computer-readable storage medium of claim 15, including program code for assigning each of the footprints a name that incorporates each of the parameters.

17. The computer-readable storage medium of claim 15, wherein the features represent at least one of pads on a printed circuit board and apertures in a stencil.

18. The computer-readable storage medium of claim 15, including program code for scaling data in the footprint as a function of X- and Y-coordinate differences resulting from effects of at least one of a printed circuit board manufacturing process and a stencil manufacturing process.

19. The computer-readable storage medium of claim 18, including program code for scaling data in the footprint as a function of rotational coordinate differences resulting from effects of at least one of the printed circuit board manufacturing process and the stencil manufacturing process.

20. A method for modifying feature data comprising:

accepting data indicating spatial characteristics of a set of features;

incorporating the data for each feature as parameters in a footprint name;

creating a library that includes the footprint names;

applying a footprint filter that specifies criteria for one or more parameters to the footprint names in the library to select footprint names that meet the specified criteria;

applying a modification parameter to the footprint names selected by the footprint filter to modify one or more parameters in the selected footprint names.

21. The method of claim 20, further comprising utilizing at least one of the footprint names to change the spatial characteristics of an object.

22. The method of claim 21, wherein the spatial characteristics include position and dimensions.

* * * * *